INVENTOR.
RIJKENT J. NIENHUIS
BY
Frank R. Trifari
AGENT

INVENTOR.
RIJKENT J. NIENHUIS
BY
Frank R. Trifari
AGENT

INVENTOR.
RIJKENT J. NIENHUIS

BY

Frank R. Trifari
AGENT

United States Patent Office 3,484,865
Patented Dec. 16, 1969

3,484,865

INTEGRATED SEMICONDUCTOR DEVICE INCLUDING IGFET WITH INTERDIGITATED STRUCTURE

Rijkent Jan Nienhuis, Nijmegen, Netherlands, assignor, by mesne assignments, to U.S. Philips Corporation, New York, N.Y., a corporation of Delaware Filed Feb. 5, 1968, Ser. No. 703,065
Claims priority, application Netherlands, Feb. 28, 1967, 6703134
Int. Cl. H01l *11/14, 19/00*
U.S. Cl. 317—235 12 Claims

ABSTRACT OF THE DISCLOSURE

A semiconductor device comprising an insulated gate field effect transistor with interdigital source and drain, wherein the means for connection to one of the source and drain is provided through the semiconductor bulk to a surface located apart from the active electrode zones. The advantage is to provide more space at the active electrode zones for the gate connection and the connection to the other electrode. Moreover, the gate electrode can be provided so as not to overlie the drain, reducing the feedback capacitance. In one embodiment, the drain and gate electrodes are on one surface of a semiconductive wafer, and the connection for the source zone is made through the wafer from the opposite surface.

Figure 1:
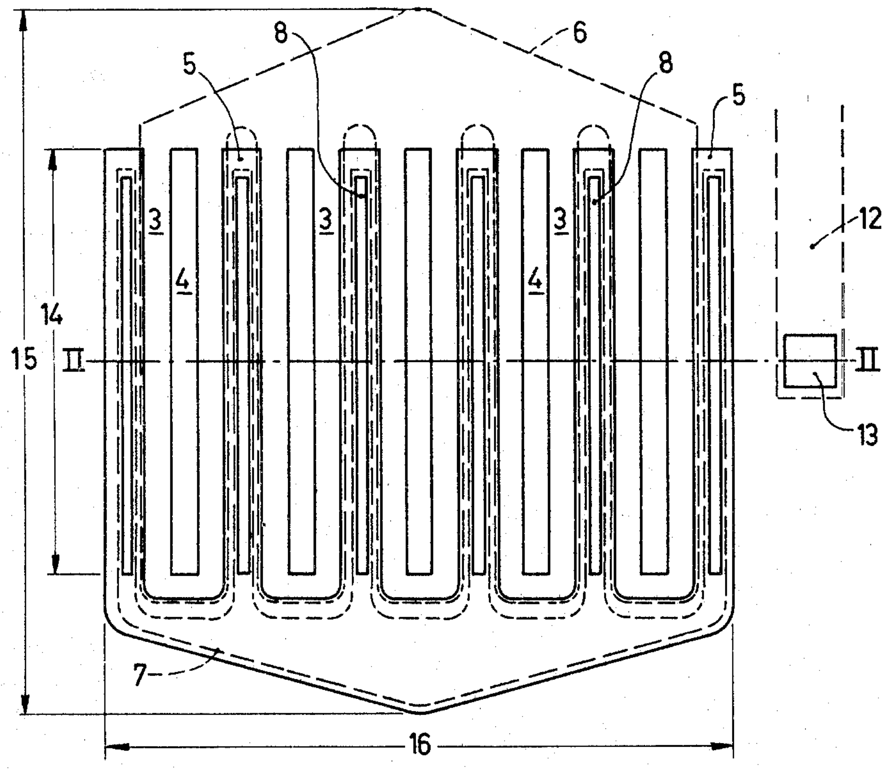

The invention relates to a semiconductor device comprising a semiconductor body covered on one surface, termed hereinafter, the upper face, at least partially by an insulating layer, in which body one or more semiconductor structures serving as circuit elements, are arranged, which structures comprise at least one field-effect transistor of the type having an insulated gate electrode and comprising a substrate region of the one conductivity type adjacent the upper face and electrode zones of the other conductivity type also adjacent the upper face and separated from each other by the substrate region and belonging to the groups of source and drain electrodes, whilst on the insulating layer between an electrode zone of one group and a further electrode zone of the other group there is arranged a metal layer serving as a gate electrode and said further electrode zone is provided with a connecting conductor, said one electrode zone of the one group forming an interdigital system with said further electrode zone.

The invention furthermore relates to semiconductor devices having field-effect transistors of said type, also termed MOST (metal-oxide-semiconductor-transistor) or IGFET (insulated-gate-field-effect-transistor), which have more than two electrode zones or more than one gate electrode.

The invention relates, moreover, to a method of manufacturing a semiconductor device of the kind set forth and a circuit arrangement comprising such a semiconductor device.

The term circuit element in the sense of the invention is to denote herein and hereinafter passive and active structures capable of forming an electrical circuit by interconnection, such as diodes, transistors, multilayer-structures, resistors, capacitors and so on.

Semiconductor devices having a field-effect transistor of the kind described are known and may be employed, for example, for processing or amplifying electrical signals. In the operational state, a potential difference is then applied between two electrode zones so that the pnp-junction between the substrate region and one of the electrode zones associated with a drain electrode is connected in the reverse direction. Owing to a variable voltage difference applied between the gate electrode and the substrate region a current channel of the other conductivity type and of variable conduction is obtained between the two said electrode zones.

In such known semiconductor devices the source and drain electrodes and the gate electrodes are connected to connecting conductors, all of which are arranged on the surface to which the electrode zones are adjacent.

Such MOS-transistors, in which the source and drain electrodes form interdigital systems, involve the problem that the gate electrode can be constructed either not at all or only with great difficulty as an interdigital system between the source and drain electrodes. In practice the gate electrode is therefore provided usually in the form of a metal layer separated from these electrodes by an oxide layer and applied across the source and drain electrodes and connected to a conductor. Since in this construction the gate electrode covers substantially completely the drain electrode, the capacitance between the drain electrode and the gate electrode is fairly high. This feedback capacitance may have a highly disturbing effect, particularly with higher frequencies.

Moreover, in the said known construction the current conveying portion of the semiconductor body is comparatively very small, since the source and drain electrodes occupy only a small part of the body. With field-effect transistors of said type both the source electrode and the drain electrode therefore have a comparatively high series resistance, which gives rise to undesirable losses especially with devices for higher power.

The invention has for its object to provide a novel structure of semiconductor devices of the kind set forth, in which the aforesaid difficulties involved in the known devices are obviated completely or for an appreciable part.

The invention is based on the recognition of the fact that with such devices the connection of one of the electrode zones to an adjacent region of the same conductivity type, which is adjacent a surface of the semiconductor body only outside the region occupied by the field-effect transistors, may provide geometrically important advantages.

According to the invention in a semiconductor device of the kind set forth said further electrode zone is connected to a metal layer forming an interdigital system with the gate electrode, whilst the one electrode zone of the one group is connected to an adjacent zone of the other conductivity type, which is located in the region of semiconductor body delimiting said electrode zone at least partially beneath the substrate region and is adjacent a surface of the body only outside the surface region occupied by the electrode zones and the gate electrode, which adjacent zone is connected to a conductor.

In the term "connecting" conductor is to denote herein an electrical lead adapted to be connected to a selected potential. Such a connecting conductor may be formed by a metal wire or a metal track, but also by a diffused zone of the semiconductor body.

A semiconductor device according to the invention has the important advantage that one of the electrode zones of said field-effect transistor can be connected beyond the region occupied geometrically by the field-effect transistor so that within the geometrical boundaries of the transistor a space is obtained for a contact with the other electrodes.

Thus, by applying the invention the possibility is obtained to construct all electrodes in the form of relatively interdigital systems, whilst by avoiding redundant overlap, for example, the feedback capacitance between the gate electrode and the drain electrode can be materially reduced.

The adjacent zone serving in accordance with the invention for providing contact to one of the electrode zones may be adjacent any desired surface of the semiconductor body. In a preferred embodiment of the invention, however, the adjacent zone joins a body surface located opposite the upper face, which body surface will be termed hereinafter the lower face. This lower face is provided in practice on a bottom plate so that without additional connections the electrode zone concerned is connected.

In other cases, however, it may be preferred to have contacts with all electrodes of the device, and hence also with the adjacent zone, on the upper face. A further preferred embodiment of the invention is characterized in that the adjacent zone joins said upper face. According to the invention this provides, as compared with known constructions, the advantage that, although all electrodes have their contacts at the same surface, one of the electrode zones is connected outside the geometrical dimensions of the field-effect transistor so that the lack of space involved in known devices for contacts is obviated to a considerable extent.

A further important preferred embodiment is characterized in that the adjacent zone extends beneath the substrate region solely outside the region located beneath said other electrode zone of the other group. In this manner the capacitance between source and drain electrode is reduced, whilst, in addition, any disturbing effect of a parasitic transistor structure formed by the other electrode zone, the adjacent zone and the intermediate substrate region, is avoided.

A further preferred embodiment of the invention is characterized in that said adjacent zone extends in the direction of thickness of the semiconductor body over at least half and preferably at least 80% of the distance between the lower face and the upper face. As a result the current conveying portion of the semiconductor body is considerably enlarged as compared with known structures, higher power owing to the reduced series resistance of said electrode zone.

It is often necessary to connect the substrate region, since the pn-junction between the source electrode and the substrate region is just not injecting appreciably in the substrate region, when a voltage difference is applied between the source electrode and the drain electrode. In some cases, however, it may yet be desirable to provide a conductor on the substrate region in order to use the latter, for example, as a second gate electrode. In accordance with the invention it is then advantageous to provide this conductor on the upper face outside the region occupied by the electrode zones and the gate electrode.

The adjacent zone of the other conductivity type can be connected to a conductor formed by a wire or a contact layer. In some cases, for example, in integrated circuits, however, the adjacent zone is advantageously connected to a zone of the other conductivity type associated with another circuit element arranged in the semiconductor body, for example, the collector of a transistor or the drain zone of a further MOS-transistor and so on.

A method of manufacturing a semiconductor device according to the invention, in which a substrate region of the one conductivity type is grown epitaxially on a supporting body or -body part, on which substrate region electrode zones of the other conductivity type associated with the groups of source and drain electrodes are provided and in which on the substrate region, between an electrode of one group and another electrode of the other group there is provided an insulating layer on which the gate electrode is provided, is characterized in accordance with the invention, in that the substrate region is provided on a supporting body or -body part of the other conductivity type and in that the one electrode zone of the one group is connected to the supporting body or -body part, whereas the other electrode zone of the other group is applied to the substrate region. This method is advantageously carried out so that the supporting body is provided by epitaxial growth with a layer of the one conductivity type, in which the electrode zones are diffused, whilst the electrode zone of one group is diffused throughout the thickness of the layer up to the supporting body.

The source and drain electrode zones may be provided not only by diffusion but also, for example, by epitaxial techniques. The supporting body or -body part may be provided, for example, with a first epitaxial layer of the one conductivity type at the side of or adjoining a second epitaxial layer of the other conductivity type, after which the electrode zone of the other group is diffused into the first epitaxial layer, the electrode zone of the one group being formed by the second epitaxial layer.

The electrode zone of one group and the adjacent zone may also be formed both by parts of the supporting body or -body part itself. In a preferred embodiment of the invention a surface of the supporting body or -body part is provided to this end with a local depression, after which this surface is provided with an epitaxial layer of the one conductivity type, which layer is then removed beyond the depression, after which an electrode zone of the other group is diffused into the epitaxial layer, so that an electrode zone associated with the one group is formed by the part of the supporting body located beyond the depression at the side of the epitaxial layer.

The invention is finally very important in a circuit arrangement for amplifying electrical signals comprising a semiconductor device according to the invention, in which said electrode zone of the one group is common to the input circuit and to the output circuit, whilst a signal to be amplified is applied to the insulated gate electrode and the amplified signal is derived from the conductor of the other electrode zone, whilst, if desired, a signal can be amplified, in addition, to a connecting conductor provided on the substrate region.

Figure 2:
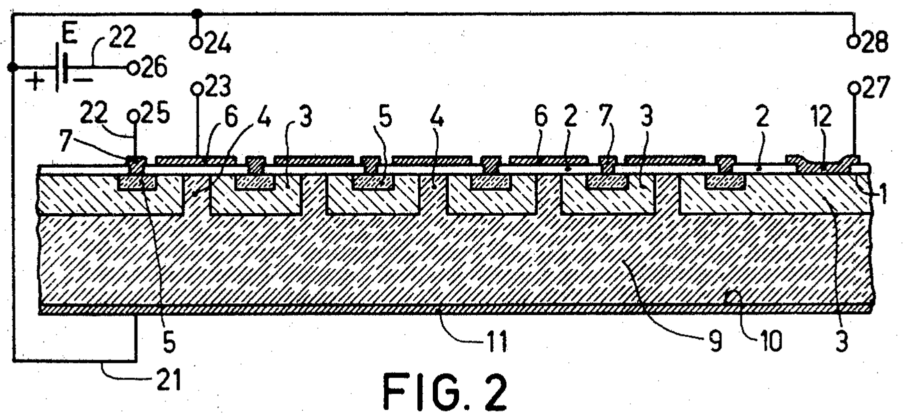

The invention will now be described with reference to a few embodiments and the drawing, in which FIGURE 1 is a plan view of a semiconductor device having a field-effect transistor according to the invention, FIGURE 2 is a diagrammatical cross-sectional view taken on the line II—II of the field-effect transistor of FIGURE 1, FIGURES 3 to 5 are diagrammatical cross-sectional views of several stages of the manufacture of the field-effect transistor of FIGURES 1 and 2, FIGURES 6*a* to 6*d* are diagrammatical cross-sectional views in part of several stages of a further method of manufacturing a semiconductor device according to the invention.

Figure 7:
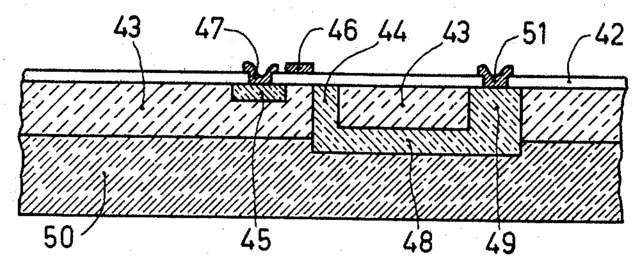
Figure 8:
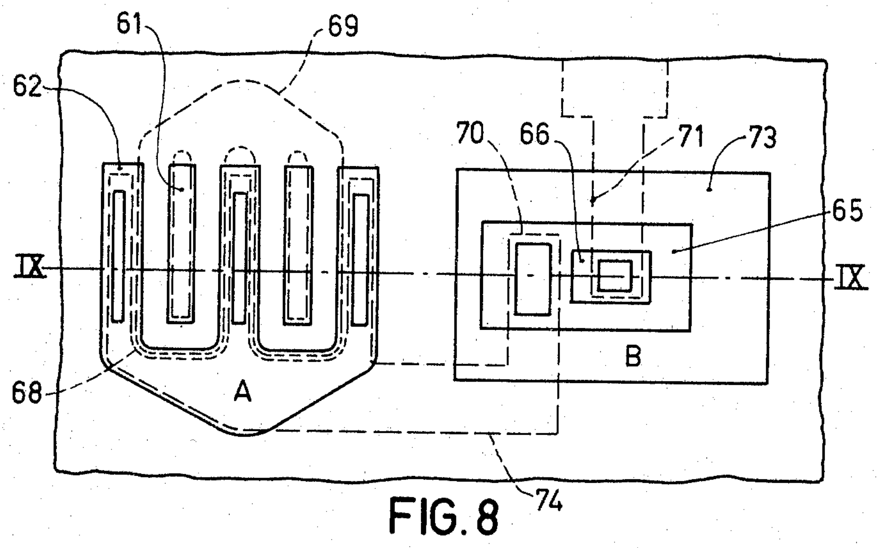
Figure 9:
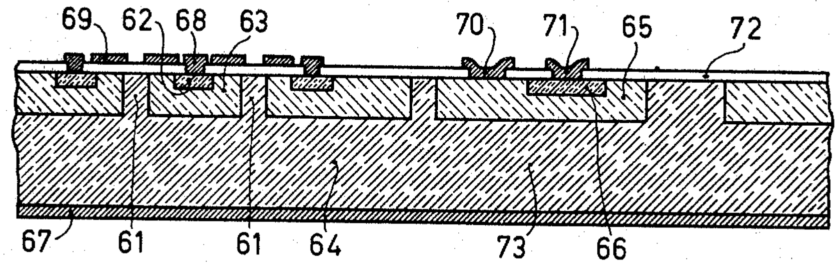

FIGURE 7 is a diagrammatical cross-sectional view of a further example of part of a semiconductor device according to the invention, FIGURE 8 is a plan view of part of an integrated circuit comprising a semiconductor device according to the invention and FIGURE 9 is a diagrammatical cross-sectional view taken on the line IX—IX of the integrated circuit of FIGURE 8.

For the sake of clarity the figures are not to scale particularly with respect to the dimension in the direction of thickness.

FIGURE 1 is a plan view and FIGURE 2 is a cross-sectional view taken on the line II—II of a semiconductor device according to the invention. The device comprises a semiconductor single crystal silicon body whose upper face 1 is partially covered by an insulating layer 2 of silica and in which a field-effect transistor with an insulated gate electrode is arranged. This field-effect transistor comprises a substrate region 3 of n-type conductivity silicon adjacent the upper face 1 and a source electrode zone 4 and a drain electrode zone 5 of p-type silicon separated from each other by the substrate region 3 and also adjacent the upper face 1.

The insulating oxide layer 2 is provided between the zones 4 and 5 with a metal layer 6, serving as a gate electrode, whilst the drain electrode 5 is provided with a conductor formed by a metal layer 7 of the oxide layer 2, which metal layer 7 is in contact via windows 8 in the oxide layer with the zone 5. In the plan views (FIGURES 1 and 8) the boundaries of metal layers provide wholly or partially on the insulating layer are indicated by broken lines. The dimensions indicated by the arrows 14, 15 and 16 are 300, 500 and 500 $\mu$m. respectively.

The p-type source zone 4 (see FIGURE 2) consisting of five partial zones is connected to a p-type adjacent zone 9, which is located in the region of the semiconductor body defining the electrode zone 4 beneath the substrate region 3. The adjacent zone 9 joins the lower face 10, located opposite the upper face 1 of the semiconductor body and is connected on said lower face 10 to a conductor formed by a metal layer 11, which may be provided on a conducting support, for example, a bottom plate.

The source electrode zone 4, connected to the adjacent zone 9, forms an interdigital system with the drain electrode zone 5 (see FIGURES 1 and 2) and the metal layer 7, connected to the zone 5, forms an interdigital system with the gate electrode 6. In the embodiment shown in FIGURES 1 and 2 the gate electrode 6 is applied across the source electrode 4. If desired, in order to reduce the capacitance between the source electrode and the gate electrode, the gate electrode may be omitted above the source electrode (see, for example, the structure of the field-effect transistor A of FIGURE 8).

The distance between the upper face 1 and the lower face 10 is about 120 $\mu$m. and the thickness of the substrate region 3 is about 8 $\mu$m. so that the adjacent zone 9 extends over more than 90% of the distance between the lower face and the upper face. The substrate region 3 is connected outside the region occupied by the electrode zones 4 and 5 and the gate electrode 6 on the upper face 1 to a conductor formed by a metal layer 12, applied to the oxide layer 2 and contacting through a window 13 in the oxide layer of the substrate region 3.

Figure 3:
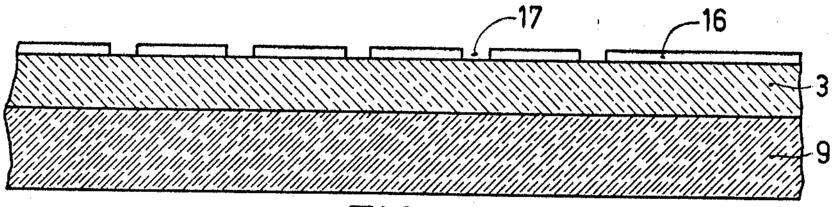
Figure 4:
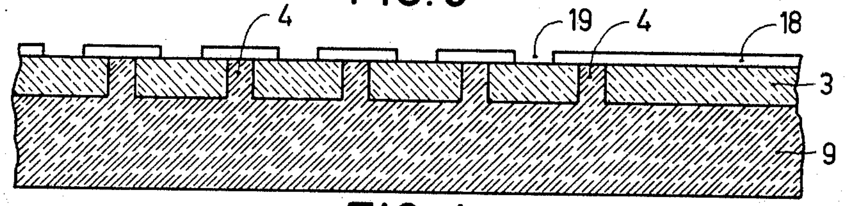
Figure 5:
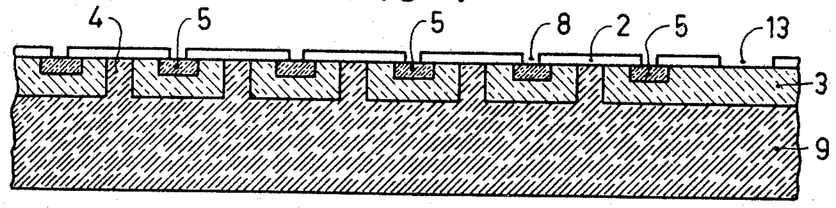
Figure 6A:
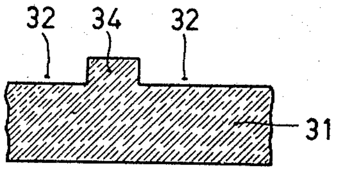
Figure 6B:
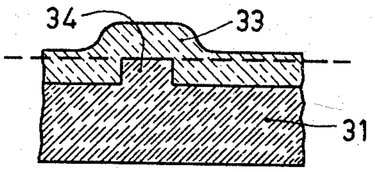
Figure 6C:
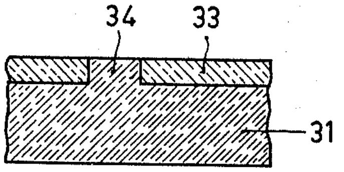
Figure 6D:
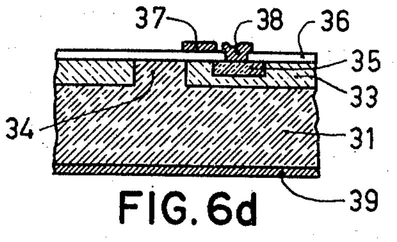

The semiconductor device of FIGURES 1 and 2 may be manufactured as follows (see FIGURES 3 to 5).

The method starts from a supporting body formed by a p-type monocrystalline silicon wafer 9 of a thickness of about 250 $\mu$m. with polished upper face and a resistivity of 0.07 ohm/cm. (see FIGURE 3). This semiconductor wafer 9 is provided with a number of identical or non-identical circuit elements. The manufacturer will be described hereinafter only with reference to the field-effect transistor of FIGURE 1, whilst only the treatments on the upper face are illustrated in the figures.

By methods generally employed in semiconductor technology the supporting body 9 is provided with an n-type conducting epitaxial layer 3 to a thickness of about 10 $\mu$m., having a resistivity of 1 ohm/cm. This layer is oxidized at 1200° C. in wet oxygen and in the resultant oxide layer 16 (see FIGURE 3) windows 17 of a width of 10$\mu$ are etched by generally employed photographic resist techniques. At 1200° C. boron is diffused through these windows until the diffused regions 4, which form the source electrode zone (see FIGURE 4), are in contact with the lower face 9, whose impurities determining the conductivity type have in the meantime diffused further over a few micrometres into the layer 2. In the resultant oxide layer 18 windows of a width of 25 $\mu$m. are etched, through which boron is again diffused to a depth of about 2$\mu$ in order to form the drain electrode zone 5 (see FIGURE 5).

In the oxide layer 2, on the upper side, windows 8 are etched to establish contacts with the drain electrode zone 5 and in the present case a further window 13 is provided for a contact with the substrate region 3.

Then metal layers 6, 7 and 12 (see FIGURE 1) are provided by depositing aluminium for the vapour phase and by selective etching of the metal with the aid of photo-resistant techniques. The metal layers 6, 7, 11 and 12 can be directly or via metal traces on the oxide layer, connected to conductors.

The wafer is subsequently ground off on the lower side and etched to a thickness of about 120$\mu$, after which the lower side is provided with a metal layer 11 (see FIGURE 2), by means of which the field-effect transistor can be mounted on a conductive support.

It is illustrated in FIGURE 2 how the resultant semiconductor device may be employed for the amplification of electrode signals. The source electrode zone 4 is connected to the positive terminal of a voltage source E through the adjacent region 9, the metal layer 11 and the direct connection 21. The drain electrode zone 5 is mechanically connected through the connecting terminals 25 and 26 to the negative terminal of E. The gate electrode 6 is connected via the connecting terminals 23 and 24 and the substrate region 3 is connected via the metal layer 12 and the connecting terminals 27 and 28 directly to the positive terminal of E. The zone 4 is therefore common to the input circuit 4–9–11–21–24–23–6 and to the output circuit 4–9–11–21–E–26–25–7. The signal to be amplified can be applied in series with a suitably chosen bias voltage to the gate electrodes 6 via the terminals 23 and 24, whereas the amplified signal can be derived via the terminals 25 and 26 from the conductor 22 of the drain electrode (5, 7). Moreover, a second signal can be applied through the terminals 27 and 28 to the metal layer 12 on the substrate region 3.

A further method of manufacturing a semiconductor device according to the invention is shown diagrammatically in a cross-sectional view in FIGURES 6*a* to 6*d* and it will now be described briefly. Although the invention according to the underlying problem is limited to interdigital structures, in FIGS. 6*a* to 6*d* and in FIG. 7 for reasons of clarity only one digit of each electrode zone is shown. The surface of a supporting body 31, for example, of p-type silicon, is provided locally by means of chemical or mechanical agency with a depression 32, after which (see FIGURE 6*b*) an epitaxial layer 33 of n-type silicon is grown on the supporting body, which layer is subsequently ground off to the level indicated in broken lines in FIGURE 6*b*, so that it is removed outside the depression from the region of the supporting body (see FIGURE 6*c*). Then a p-type conductive electrode zone 35 (see FIGURE 6*d*) is diffused into the layer 33 to serve as a drain electrode zone, whilst the aforesaid part of the supporting body 31, located outside the depression 32 at the side of the epitaxial layer 33 serves as a source electrode zone. The oxide layer 36, formed during or after the diffusion is provided with the gate electrode 37, whilst the drain zone 35 is contacted via a window in the oxide layer by a metal layer 38 and the lower face is contacted by a metal layer 39.

In the embodiments described above the adjacent zone joins the lower face of the semiconductor wafer. As stated above, it may be sometimes desirable for the adjacent zone to join the upper face and/or to extend only beneath the substrate region outside the region located beneath the other electrode zone. Such a structure is shown in a diagrammatical cross-sectional view in FIGURE 7. In this structure a supporting body 50 of, for example, p-type silicon is provided with an epitaxial layer 43 of p-type silicon, on which an oxide layer 42 is provided. In this structure the n-type conductive regions 44, 45, 48 and 49 are provided by diffusion and the metal layers 46, 47 and 51 are provided on and/or in windows of the oxide layer. Thus a field-effect transistor structure is obtained which comprises a source electrode zone 44, a drain electrode zone 45 and a gate electrode 46, the source electrode zone 44 being connected to an adjacent zone (48, 49) which joins the upper face and which extends solely outside the region located underneath the drain zone 45 and underneath the substrate region 43.

Such a structure may be obtained by providing the supporting body locally by diffusion with an n-type conducting "buried" layer prior to the application of the epitaxial layer 43, which layer provides during the growth of the layer 43 and the subsequent diffusions, the region 48. The regions 44, 45 and 49 are subsequently diffused in a manner similar to that described above from the upper face selectively into the layer 43, after which the gate electrode 46 and the contact layers 47 and 51 are applied.

Finally FIGURE 8 is a plan view and FIGURE 9 is a diagrammatical cross-sectional view taken on the line IX—IX of part of an integrated circuit, in which a field-effect transistor A, having an adjacent zone according to the invention, is connected via said adjacent zone to the collector zone of a transistor B. The field-effect transistor A, like the field-effect transistor of FIGURES 1 and 2, comprises a p-type source electrode zone 61 a p-type drain zone 62, an n-type substrate region 63 and a gate electrode 69, provided on an oxide layer 72. The source zone 61 is connected to a p-type adjacent zone 64, which is connected to a p-type collector zone 73 of the transistor B, which comprises furthermore an n-type base zone 65 and a p-type emitter zone 66. The zone 62, 65 and 66 are connected to metal layers 68, 70 and 71, indicated in broken lines in FIGURE 8. In contrast to FIGURE 1, the gate electrode 69 is not applied across the source zone 61, so that the capacitance between the source electrode and the gate electrode is reduced. The contact layers 68 of the drain electrode is connected through the oxide layer through a metal track 74 to the base zone 65 of the transistor B. The source electrode 61, the adjacent zone 64 and the collector zone 73 are contacted through the metal layer 67 on the lower side. The advantage of the application of the invention in this integrated circuit resides in the fact that the conductive connection of the source electrode of the transistor A and the collector zone of the transistor B does not require a separate metal track, so that, in addition, a more compact structure is possible.

It will be obvious that the invention is not restricted to the embodiments described above and that within the scope of the invention many variants are possible to those skilled in the art. For example, the conductivity types employed may be replaced by the opposite types and the dimensions may be modified so that analogous structures are formed. Moreover, instead of silicon other semiconductor materials may be employed, whilst the contact metals, the insulating layer and so on may be replaced by other materials. A semiconductor device according to the invention may furthermore be employed in other circuits than those mentioned above.

What is claimed is:

1. A semiconductor device comprising a semiconductor body having an upper surface and including at least one insulated-gate field-effect transistor; said semiconductor body comprising a substrate region adjacent the upper surface and of one type conductivity, spaced groups of interdigitally-arranged source and drain electrode zones adjacent the upper surface and of the opposite type conductivity, said source and drain electrode zones being spaced apart at the upper surface by channel zones of the substrate region; an insulating layer on the upper surface; a group of conductive gate electrode portions on the insulating layer and each overlying at least each of the channel zones; a group of conductive connections to one of the source and drain electrode zones on the insulating layer; said group of gate electrode portions forming an interdigital system with said group of connections to the said one electrode zones, said semiconductor body further comprising a zone of said opposite type conductivity adjacent to and contiguous with the other of the source and drain electrode zones and extending at least partly beneath the substrate region to a surface of the body lying wholly outside the region of the upper surface occupied by the electrode zones and gate electrode; and means providing a connection to the said adjacent zone and thus to the said other electrode zones.

2. A device as set forth in claim 1 wherein the said adjacent zone extends to the opposite lower surface of the semiconductor body, and the region of the body underlying the substrate region is of the opposite type conductivity.

3. A device as set forth in claim 2 wherein the body comprises a wafer whose thickness dimension is measured between the upper and lower surfaces, the substrate region has a thickness less than 20% of that of the wafer, the lower part of the wafer constitutes the said adjacent zone and constitutes more than 80% of the thickness of the wafer.

4. A device as set forth in claim 1 wherein the said adjacent zone extends solely to the upper surface of the semiconductor body.

5. A device as set forth in claim 1 wherein the said adjacent zone extends underneath the substrate region wholly outside the region of the body located beneath said one electrode zones.

6. A device as set forth in claim 1 and further including means on the upper surface outside the region occupied by the electrode zones and the gate electrode and providing an electrical connection to the substrate region.

7. A device as set forth in claim 1 and further including at least one additional circuit element in the semiconductor body and interconnected with the field-effect transistor.

8. A device as set forth in claim 7 wherein the additional circuit element comprises a zone of the opposite type conductivity, the said adjacent zone being internally connected with the body to the last-named zone;

9. A device as set forth in claim 1 wherein the said one eelectrode zones constitute the drain electrode and the said other electrode zones constitute the source electrode.

10. An amplifying circuit arrangement comprising a semiconductor device as set forth in claim 9 and comprising an input circuit including means for applying a signal to the gate electrode, an output circuit including means for deriving the amplified signal from the connection to said drain electrode, and means connecting the source electrode common to the input and output circuits.

11. An amplifying circuit as set forth in claim 10 wherein means are provided furnishing a connection to the substrate region, and means are provided for applying a signal to be amplified to the last-named connection means.

12. A device as set forth in claim 1 wherein the gate electrode portions also overlie the other of the source and drain electrode zones.

References Cited

FOREIGN PATENTS

| | | |
|---|---|---|
| 1,349,963 | 12/1963 | France. |
| 1,060,725 | 3/1967 | Great Britain. |

JERRY D. CRAIG, Primary Examiner

U.S. Cl. X.R.

307—304

UNITED STATES PATENT OFFICE

CERTIFICATE OF CORRECTION

Patent No. 3,484,865 December 16, 1969

Rijkent Jan Nienhuis

It is certified that error appears in the above identified patent and that said Letters Patent are hereby corrected as shown below:

Column 1, line 69, "pnp" should read -- pn --. Column 3, line 37, after the comma insert -- which is important especially for MOS-transistors of --. Column 5, line 61, "lower face" should read -- wafer --; line 63, "layer 2." should read -- layer 3. --. Column 6, line 11, "electrode", second occurrence, should read -- electric --; same line, "electrode", first occurrence, should read -- electro --. Column 8, line 42, "eelectrode" should read -- electrode --.

Signed and sealed this 8th day of September 1970.

(SEAL)
Attest:

EDWARD M.FLETCHER,JR.
Attesting Officer

WILLIAM E. SCHUYLER, JR.
Commissioner of Patents